United States Patent
Lai et al.

(10) Patent No.: US 7,349,220 B2
(45) Date of Patent: Mar. 25, 2008

(54) MEMORY MODULE ASSEMBLY

(75) Inventors: Cheng-Tien Lai, Tu Cheng (TW);
Zhi-Yong Zhou, Shenzhen (CN);
Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 113 days.

(21) Appl. No.: 11/308,849

(22) Filed: May 15, 2006

(65) Prior Publication Data

US 2007/0263361 A1    Nov. 15, 2007

(51) Int. Cl.
*H05K 7/20* (2006.01)

(52) U.S. Cl. .................. 361/719; 361/704; 361/715; 257/718; 257/719; 165/80.3; 165/185

(58) Field of Classification Search ............... None
See application file for complete search history.

(56) References Cited

U.S. PATENT DOCUMENTS

| | | | | |
|---|---|---|---|---|
| 5,109,318 A * | 4/1992 | Funari et al. | ............... | 361/710 |
| 5,815,371 A * | 9/1998 | Jeffries et al. | ............... | 361/704 |
| 5,966,287 A * | 10/1999 | Lofland et al. | ............. | 361/704 |
| 6,119,765 A * | 9/2000 | Lee | ........................... | 165/80.3 |
| 6,233,150 B1 * | 5/2001 | Lin et al. | ..................... | 361/704 |
| 6,535,387 B2 * | 3/2003 | Summers et al. | ........... | 361/704 |
| 7,079,396 B2 * | 7/2006 | Gates et al. | ................. | 361/719 |
| 7,221,569 B2 * | 5/2007 | Tsai | ........................... | 361/704 |
| 2003/0026076 A1 | 2/2003 | Wei | | |
| 2005/0276021 A1 * | 12/2005 | Gates et al. | ................. | 361/709 |

* cited by examiner

*Primary Examiner*—Boris Chérvinsky
(74) *Attorney, Agent, or Firm*—Jeffrey T. Knapp

(57) ABSTRACT

A memory module assembly includes a printed circuit board (10) having a heat-generating electronic component (50) thereon, a pair of heat-dissipating plates (20) attached on the printed circuit board, and a pair of clamps (30) clamping the heat-dissipating plates and the printed circuit board therebetween. Each heat-dissipating plate includes a pair of supporters (28) and a handle (24) rotatably engaging with the supporters. The heat-dissipating plates are installed on the opposite sides of the printed circuit board by exerting a force to the handles to make them move toward each other wherein the force overcomes the spring force of the clamps.

15 Claims, 6 Drawing Sheets

MEMORY MODULE ASSEMBLY

FIELD OF THE INVENTION

The present invention relates generally to memory module assemblies, and more particularly to a memory module assembly including a pair of handles for simplifying an installation of a heat sink to be attached on opposite surfaces of a printed circuit board with an electronic component thereon.

DESCRIPTION OF RELATED ART

Memory module assemblies that are currently in the use generally do not require cooling devices to dissipate heat. The electronic components and memory module assemblies currently available, which are operated on or below 66 MHz do not generate heat that requires a cooling device for dissipating the heat. However, as the industry progresses, memory module assemblies, such SDRAM DIMM memory module assemblies will be required to operate at 100 MHz or more. For these modern memory module assemblies, heat sinks will be required to remove heat generated thereby. However, since the memory module assemblies each have a limited board area and are mounted on a motherboard of a computer, mounting the heat sink to the memory module assembly becomes an issue.

SUMMARY OF INVENTION

A memory module assembly in accordance with a preferred embodiment comprises a printed circuit board having heat-generating electronic components thereon, a pair of heat-dissipating plates attached on opposite sides of the printed circuit board and two clamps clamping the heat-dissipating plates and the printed circuit board therebetween. Each heat-dissipating plate comprises a pair of supporters, and a handle engaging with the supporters. The heat-dissipating plates are installed on the opposite sides of the printed circuit board under the help of the handles to overcome the spring force of the clamps.

Other advantages and novel features will become more apparent from the following detailed description of preferred embodiments when taken in conjunction with the accompanying drawings, in which:

BRIEF DESCRIPTION OF DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION

Figure 1:
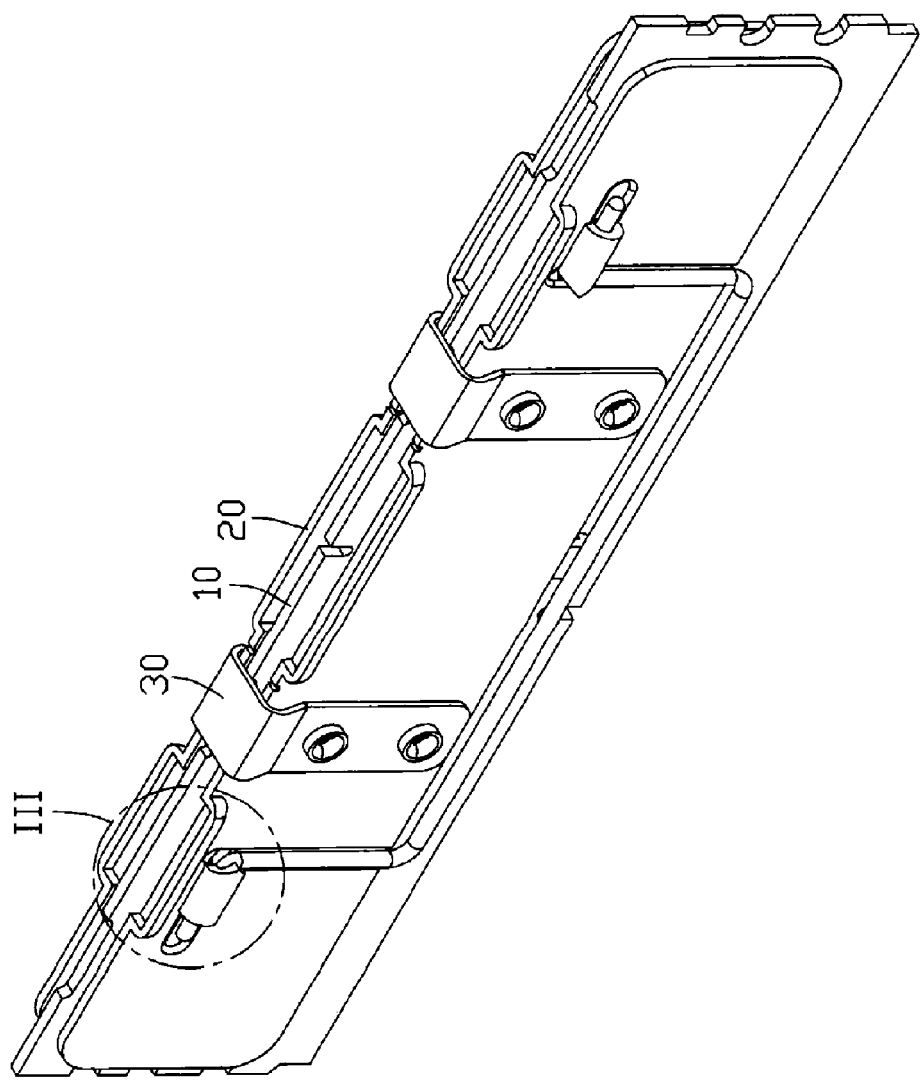
FIG. 1 is an assembled view of a memory module assembly in accordance with a preferred embodiment of the present invention.
Figure 2:
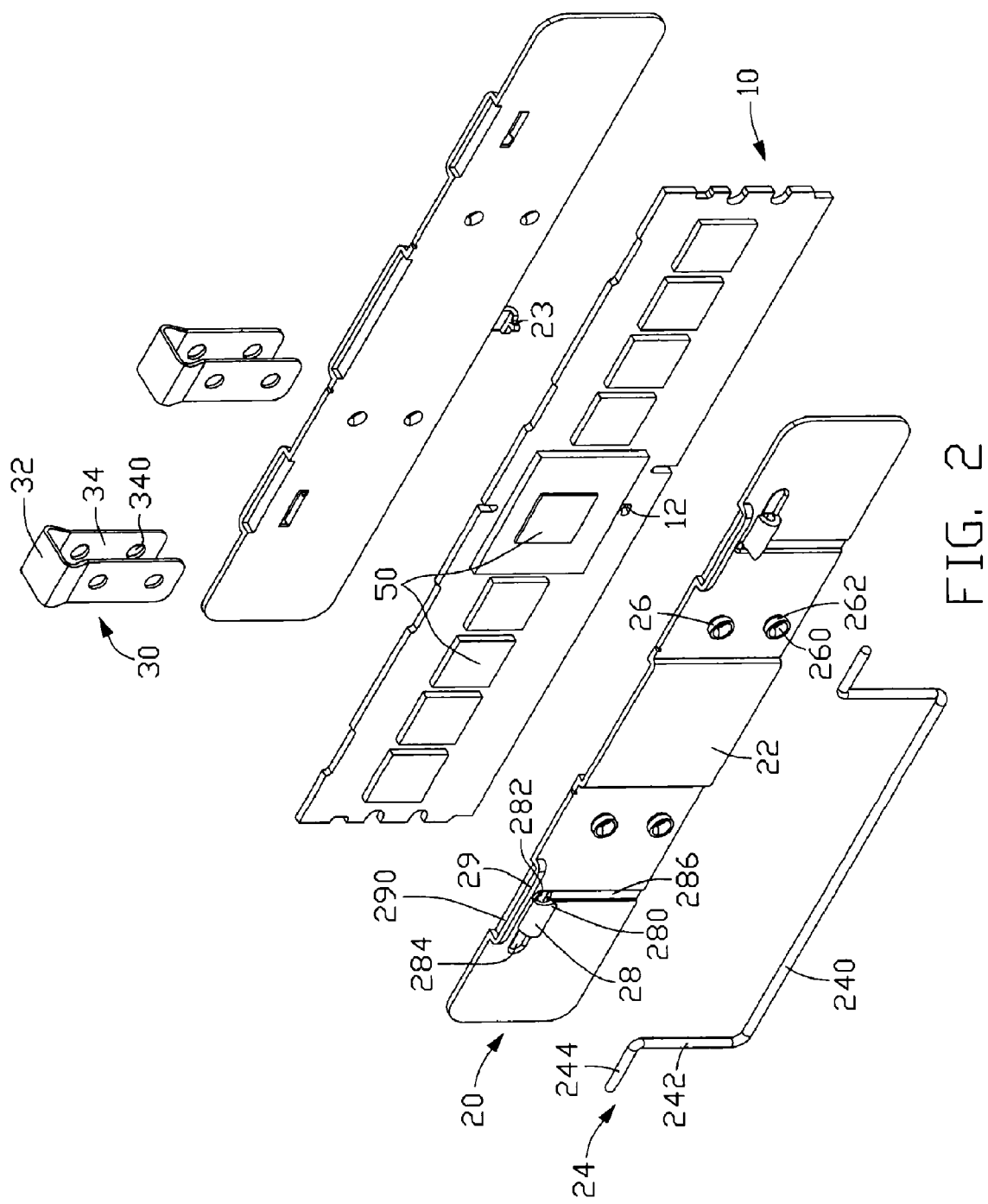
FIG. 2 is an exploded and isometric view of FIG. 1.

FIGS. 1-2 show a memory module assembly in accordance with a preferred embodiment of the present invention. The memory module assembly comprises a printed circuit board 10 having a plurality of heat-generating electronic components 50 thereon, a pair of heat-dissipating plates 20 attached on opposite sides of the printed circuit board 10, two clamps 30 for securing the heat-dissipating plates 20 onto the opposite sides of the printed circuit board 10. The printed circuit board 10 has a rectangular shape having first and second faces and two long sides and two short sides between the long sides. A through hole 12 is defined in a middle of the printed circuit board 10 near a bottom one of the long sides thereof.

Figure 3:
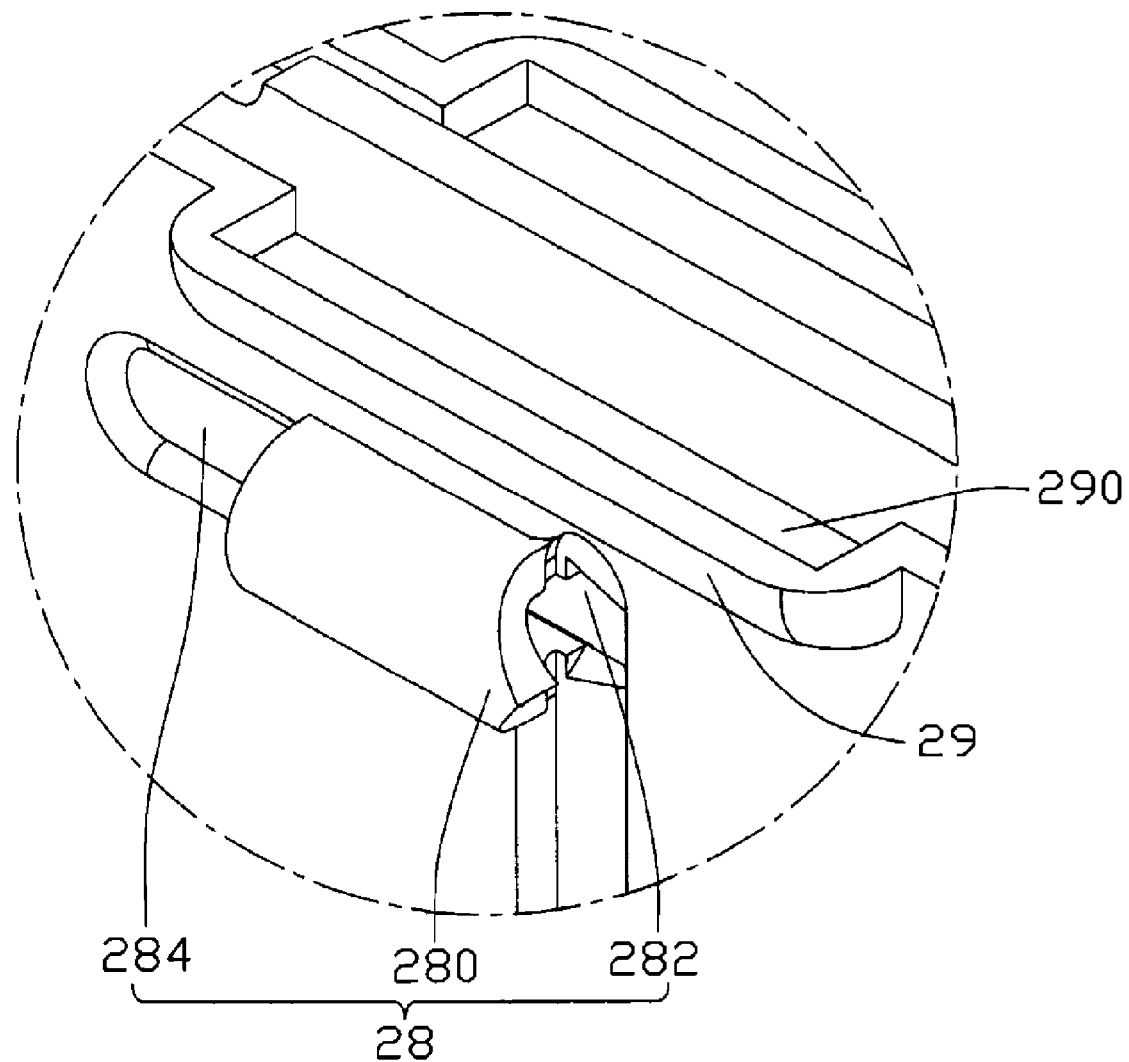
FIG. 3 is an enlarged view of an indicated portion III of FIG. 1.

Referring to FIGS. 2-3, each heat-dissipating plate 20 comprises a rectangular-shaped body 22 and a handle 24 arranged on the body 22. The body 22 of one of the heat-dissipating plates 20 forms a hook 23 for inwardly extending from a bottom thereof into the through hole 12 of the printed circuit board 10, for avoiding a movement of the body 22 along the long sides of the printed circuit board 10. Four bowl-shaped protruding portions 26 are symmetrically positioned on a front surface of the body 22. Each protruding portion 26 defines a mouth 260 in a middle thereof by stamping. An outer collar 262 around the mouth 260 is therefore formed to form a pressing portion pressed on the clamp 30. The protruding portion 26 further comprises a shrunk bottom having a smaller diameter than that of the mouth 260 for engaging with the clamp 30. A pair of supporters, such as a pair of semicircular vaults 28 are formed on the body 22 beside the protruding portions 26 for the handles 24 to be inserted into. The vaults 28 are stamped from the body 22 or formed by other means. Each vault 28 has a triangular block 280 at a free end thereof to avoid movement of the handle 24 in a free state. A hole 282 is defined in the body 22 in a position corresponding to that of the triangular block 280. A groove 284 is defined in the body 22 corresponding to the opposite free end of the vault 28, shaped for allowing the handle 24 to be accepted therein. A pair of slots 286 are defined in the body 22 between the vaults 28 and the protruding portions 26 along a direction of a short side of the body 22. A pair of strip-shaped ribs 29 are formed in an upper end of the front surface of the body 22 and a pair of depressed portions 290 are defined in a rear surface of the body 22 corresponding to the ribs 29.

The handle 24 has an operating portion 240 extending parallel to a long side of the body 22, a pair of resisting portions 242 extending from opposite ends of the operating portion 240 and accommodated in the slots 286 and a pair of running portions 244 extending from free ends of the resisting portions 242, respectively. The handle 24 is made by folding a flexible metal wire. When the handle 24 is in a free state, the running portions 244 are attached on the front surface of the body 22 and the resisting portions 242 are blocked by the triangular blocks 280.

The clamps 30 are used for clamping the heat-dissipating plates 20 on the opposite sides of the printed circuit board 10. Each clamp 30 has an n-shaped configuration and comprises a connecting portion 32 and a pair of elastic pressing portions 34 extending from two free ends of the connecting portion 32. Each pressing portion 34 defines a pair of circular holes 340 therein. The protruding portions 26 extend into the circular holes 340 and the bottoms of the protruding portions 26 of the body 22 are blocked in the circular holes 340. The collars 262 of the protruding portions 26 deform under pressure to spread outwardly so as to be attached to the pressing portions 34. Thus, the clamps 30 are fastened onto the bodies 22 of the heat-dissipating plates 20.

Figure 4:
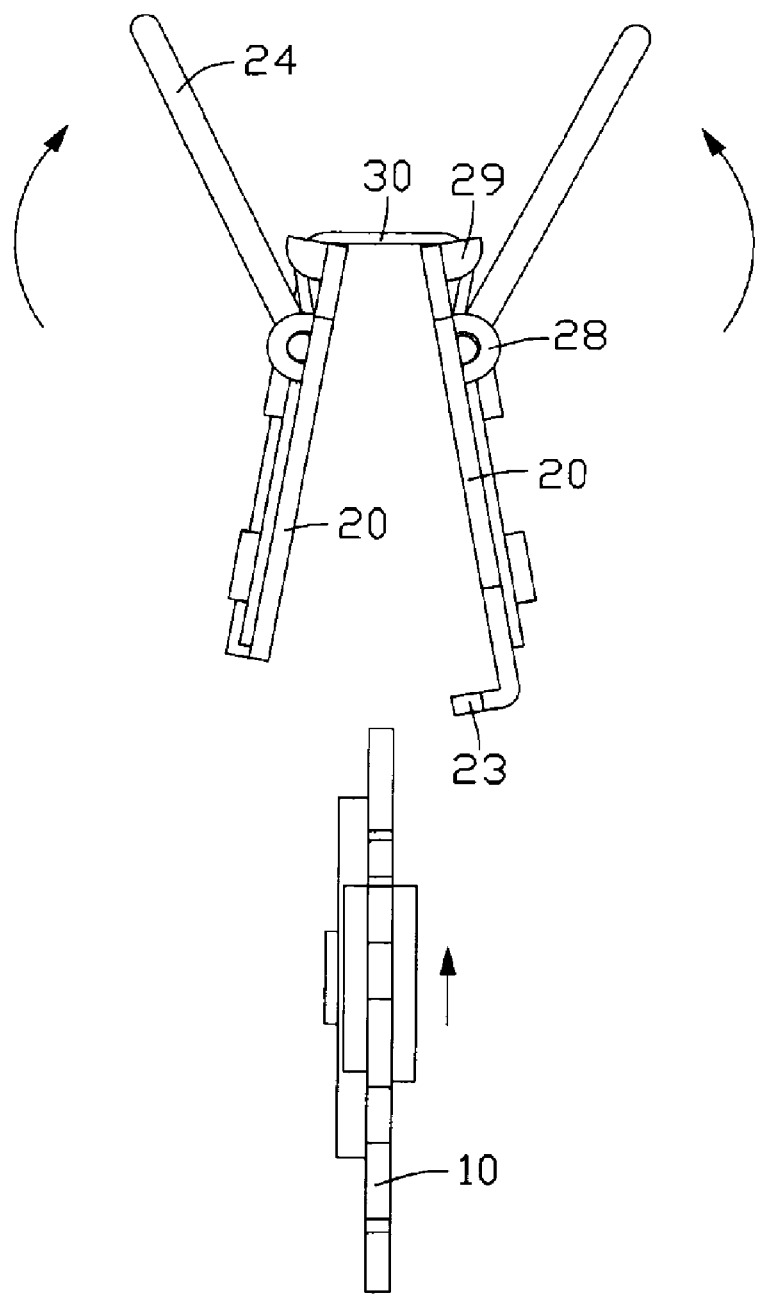
FIG. 4 is a preassembly view of FIG. 1 with a printed circuit board and a pair of heat-dissipating plates.
Figure 5:
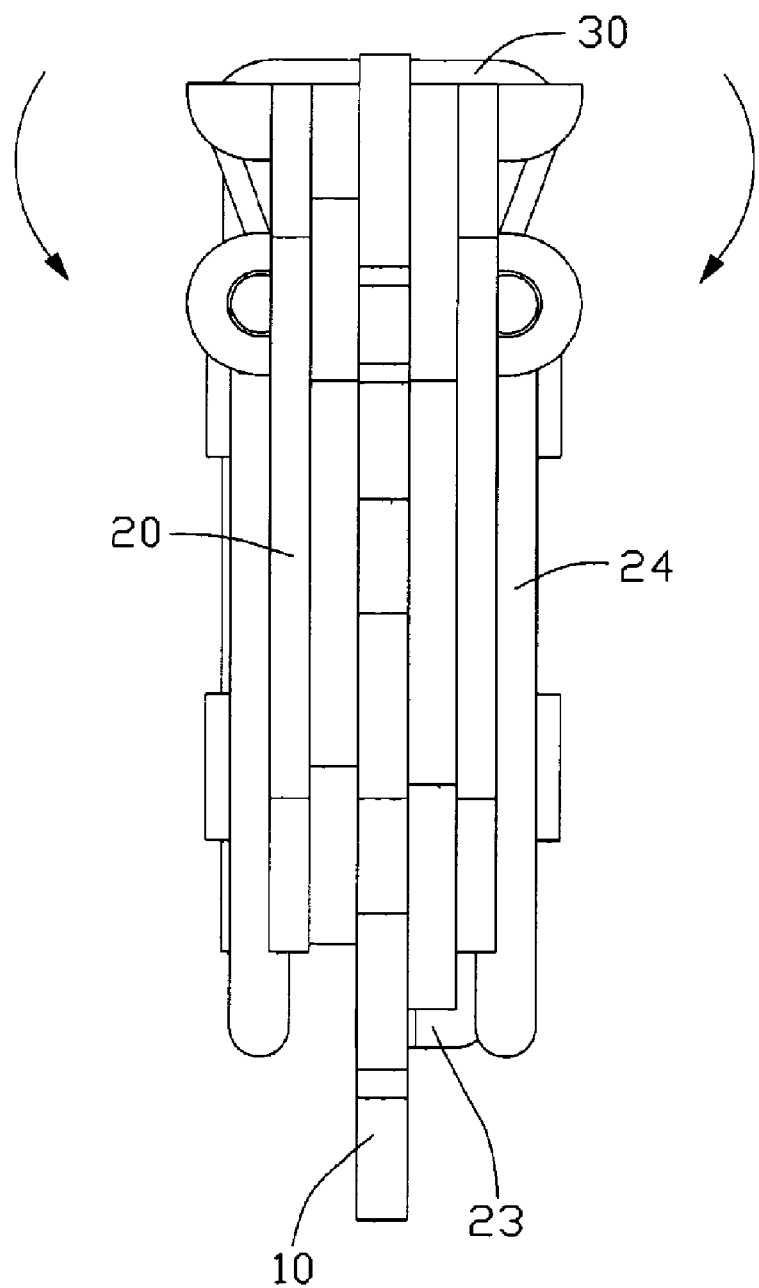
FIG. 5 is an assembled view of FIG. 4.

In assembly, referring to FIG. 4, when a force acts on the handles 24, the running portions 244 of the handles 24 are rotated in the vaults 28 and the operating portions 240 lift from the bottom of the heat-dissipating plates 20 to the top of the heat-dissipating plates 20 until the resisting portions 242 of the handles 24 are rest on the ribs 29. The force acting on the operating portions 240 of the handles 24 inwardly presses the operating portions 240 to render bottoms of the heat-dissipating plates 20 outwardly opening to form a big space for the printed circuit board 10 to insert therebetween, when the force acting on the handles 24 overcomes the spring force of the clamps 30 acting on the heat-dissipating plates 20. When the printed circuit board 10 is sandwiched between the two heat-dissipating plates 20 at a predetermined position, the force acting on the handles 24 is removed and the clamps 30 firmly clamp the heat-dissipating plates 20 on opposite surfaces of the printed circuit board 10 and the hook 23 of the heat-dissipating plate 20 extends into the through hole 12 of the printed circuit board 10 as shown in FIG. 5. The heat-dissipating plates 20 intimately and thermally contact with the heat-generating electronic components 50, which according to the present invention are memory chips. Finally, referring to FIG. 5, the handles 24 are moved downwardly to return to their original position with the operating portions 240 stopped under the bottoms of the heat-dissipating plates 20 and the resisting portions 242 accommodated in the slots 286.

In the present invention, the handles 24 are disposed on the outer surfaces of the heat-dissipating plates 20. It only takes force acting on the handles 24 to make the heat-dissipating plates 20 open outwardly by overcoming the spring force of the clamps 30. There is no need for additional tools and installation of the heat-dissipating plates 20 onto the printed circuit board 10 is made easy and simple.

Figure 6:
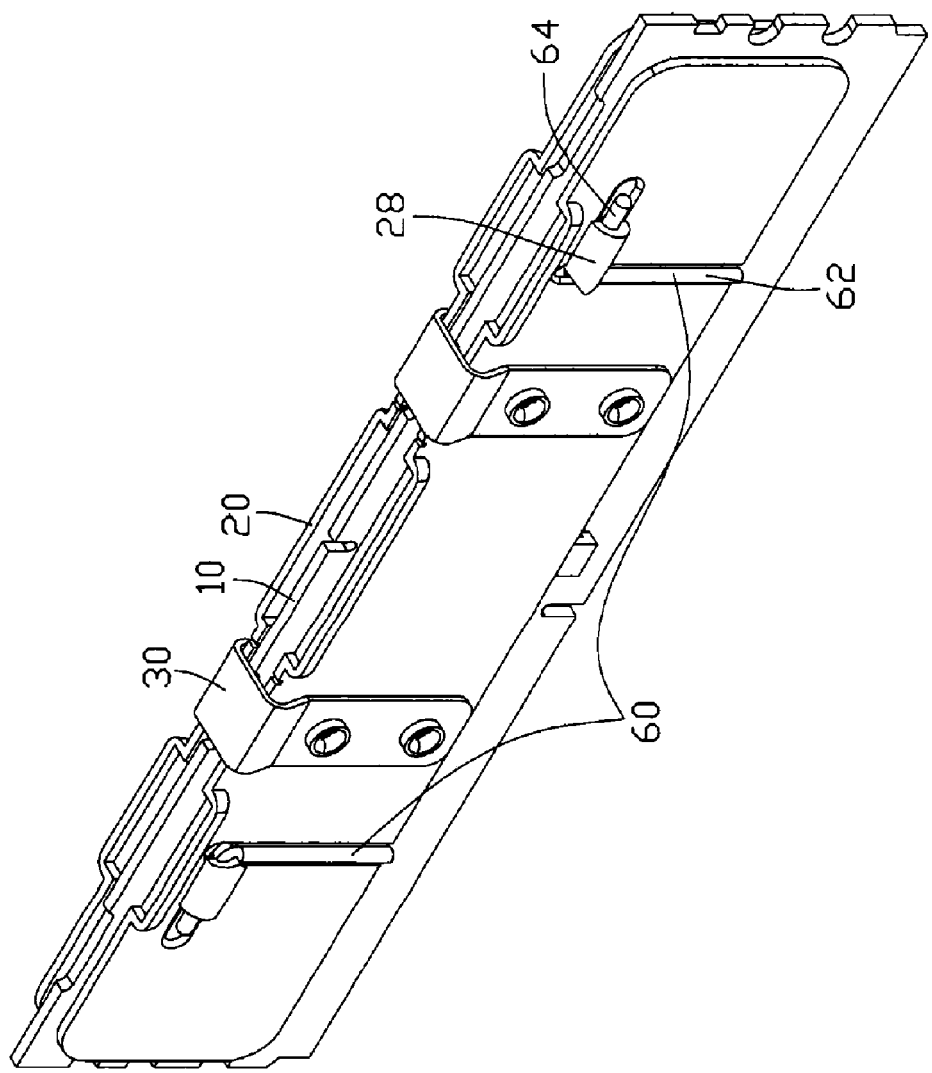
FIG. 6 is an assembled view of a memory module assembly in accordance with another embodiment.

Referring to FIG. 6, in another embodiment of the present invention, the handles 60 only comprise a pair of resisting portions 62 arranged on opposite sides of the clamps 30 and a pair of running portions 64 inserted in the vaults 28. The force acting on the resisting portions 62 of the handles 60 drives the heat-dissipating plates 20 to open outwards to form a big space for the printed circuit board 10 to be inserted therebetween, It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:
a printed circuit board having a heat-generating electronic component mounted thereon;
a pair of heat-dissipating plates attached on opposite sides of the printed circuit board, each heat-dissipating plate comprising a pair of supporters;
a pair of clamps for clamping the heat-dissipating plates onto the opposite sides of the printed circuit board; and
a pair of handles arranged on the heat-dissipating plates by engaging with the supporters, each handle comprising a pair of resisting portions and a pair of running portions extending from the resisting portions, the running portions being engaged with the supporters and capable of rotating in the supporters;
wherein the heat-dissipating plates are installed on opposite sides of the printed circuit board by outside forces acting on the resisting portions of the handles to press the resisting portions onto the heat-dissipating plates for overcoming spring forces of the clamps.

2. The memory module assembly as claimed in claim 1, wherein each clamp comprises a connecting portion and a pair of elastic pressing portions extending from two free ends of the connecting portion, the pressing portions being clamped on outer faces of the heat-dissipating plates to connect the heat-dissipating plates on the printed circuit board.

3. The memory module assembly as claimed in claim 1, wherein each handle comprises an operating portion and the resisting portions extend from free ends of the operating portion, the resisting portions being attached on outer faces of the heat-dissipating plates when the handles are in a free state.

4. The memory module assembly as claimed in claim 3, wherein the each running portion is inserted into one of the supporters.

5. The memory module assembly as claimed in claim 4, wherein the supporters are a pair of semicircular vaults stamped from its heat-dissipating plate.

6. The memory module assembly as claimed in claim 5, wherein each vault has a block at a free end thereof to avoid movement of the handle in a free state and each handle is made by folding a flexible metal wire.

7. The memory module assembly as claimed in claim 5, wherein each heat-dissipating plate defines a pair of slots accommodating the resisting portions therein.

8. The memory module assembly as claimed in claim 7, wherein each heat-dissipating plate forms a pair of ribs on an upper end thereof for the resisting portions to rest on during the acting of the outside force on the resisting portions of the handles.

9. A memory module assembly comprising:
a printed circuit board having a plurality heat-generating electronic component being mounted thereon;
a pair of heat-dissipating plates attached on opposite sides of the printed circuit board and thermally connecting with the heat-generating electronic components, each heat-dissipating plate comprising a pair of supporters thereon;
a pair of substantially n-shaped clamps each having a pair of elastic pressing portions clamping the heat-dissipating plates on the opposite faces of the printed circuit board; and
a pair of handles disposed on the heat-dissipating plates, each handle comprising an operating portion and a pair of resisting portions extending from the operating portion and a pair of running portions extending from the resisting portions, the running portions being engaged with the supporters and capable of rotating in the supporters;
wherein the printed circuit board is sandwiched between the heat-dissipating plates by the clamps, and wherein by exerting a force to the operating portions of the handles to push the operating portions of the handles to move toward each other, spring forces of the clamps acting on the heat-dissipating plates can be overcome whereby two common sides of the heat-dissipating plates can be opened.

10. The memory module assembly as claimed in claim 9, wherein the supporters are located beside the clamps.

11. The memory module assembly as claimed in claim 10, wherein each heat-dissipating plate forms a pair of ribs on an upper end thereof for the resisting portions resisting on during the exerting of the force on the operation portions of the handles.

12. The memory module assembly as claimed in claim 9, wherein the pressing portions of the clamps are located between the resisting portions of the handle.

13. The memory module assembly as claimed in claim 12, wherein one of the heat-dissipating plates forms a hook at bottom thereof to extend into the printed circuit board.

14. A method for mounting a printed circuit board between a pair of heat-dissipating plates which are connected together by a n-shaped clamp and each of which is provided with a handle pivotably mounted thereon, the printed circuit board having a plurality of memory chips thereon, the method comprising:

pivotably pushing operating portions of the handles to move toward each other to a degree that a spring force exerted on the heat-dissipating plates by the clamp is overcome and two common sides of the heat-dissipating plates opposite the operating portions are opened to expose an internal space between the heat-dissipating plates;

inserting the printed circuit board into the internal space via the opened common sides to reach a predetermined position; and releasing the force acting on the operating portions of the handles so that the heat-dissipating plates return to their original positions wherein the heat-dissipating plates thermally connect with the memory chips.

15. The method as claimed in claim 14, wherein one of the heat-dissipating plates is provided with a hook, the hook extending through the printed circuit board after the force acting on the operating portions of the handles is released.

* * * * *